US009056985B2

(12) United States Patent
Ko et al.

(10) Patent No.: US 9,056,985 B2
(45) Date of Patent: *Jun. 16, 2015

(54) CURABLE COMPOSITION

(71) Applicant: LG CHEM, LTD, Seoul (KR)

(72) Inventors: Min Jin Ko, Daejeon (KR); Kyung Mi Kim, Daejeon (KR); Young Ju Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/458,008

(22) Filed: Aug. 12, 2014

(65) Prior Publication Data

US 2014/0346556 A1 Nov. 27, 2014

Related U.S. Application Data

(63) Continuation of application No. PCT/KR2014/002943, filed on Apr. 4, 2014.

(30) Foreign Application Priority Data

Apr. 4, 2013 (KR) .......................... 10-2013-0037114
Apr. 4, 2014 (KR) .......................... 10-2014-0040821

(51) Int. Cl.
*C08L 83/04* (2006.01)
*C08G 77/04* (2006.01)
*H01L 33/56* (2010.01)

(52) U.S. Cl.
CPC ................. *C08L 83/04* (2013.01); *C08G 77/04* (2013.01); *H01L 33/56* (2013.01); *C08L 2203/206* (2013.01)

(58) Field of Classification Search
None
See application file for complete search history.

(56) References Cited

U.S. PATENT DOCUMENTS

| | | | | |
|---|---|---|---|---|
| 5,674,966 A | * | 10/1997 | McDermott et al. | 528/32 |
| 6,395,338 B1 | * | 5/2002 | Benayoun et al. | 427/387 |
| 2011/0097579 A1 | * | 4/2011 | Mizuno et al. | 428/355 R |
| 2012/0056236 A1 | * | 3/2012 | Hamamoto et al. | 257/100 |
| 2012/0146088 A1 | | 6/2012 | Tanikawa et al. | |
| 2014/0191161 A1 | * | 7/2014 | Amako et al. | 252/301.36 |
| 2014/0288235 A1 | * | 9/2014 | Hirai et al. | 524/588 |

FOREIGN PATENT DOCUMENTS

| | | | |
|---|---|---|---|
| JP | 11-274571 | 10/1999 | |
| JP | 2001-196151 | 7/2001 | |
| JP | 2002-226551 | 8/2002 | |
| JP | 2009-235265 | 10/2009 | |
| JP | 2012-140617 | 7/2012 | |
| KR | 10-2008-0089400 | 10/2008 | |
| KR | 10-2012-0120005 | 11/2012 | |
| KR | 10-2013-0011998 | 1/2013 | |
| KR | 10-2012-0023125 | 8/2013 | |
| WO | WO 2013005858 A1 * | 1/2013 | ......... C08L 83/04 |
| WO | WO-2013047898 A1 * | 4/2013 | ......... C08L 83/04 |

* cited by examiner

Primary Examiner — Robert S Loewe
(74) Attorney, Agent, or Firm — McKenna Long & Aldridge, LLP

(57) ABSTRACT

Provided are a curable composition and its use. The curable composition may provide a cured product having excellent processability, workability, and adhesive property, and having no whitening and surface stickiness. The curable composition has excellent thermal resistance and crack resistance, and low gas permeability, and thus provides a device having excellent initial performance when being applied to a semiconductor device and maintaining stable performance when being used at a high temperature for a long time.

20 Claims, No Drawings

CURABLE COMPOSITION

This application is a Continuation Bypass Application of International Patent Application No. PCT/KR2014/002943, filed on Apr. 4, 2014, and claims the benefit of Korean Patent Application Nos. 10-2013-0037114, filed on Apr. 4, 2013 and 10-2014-0040821 filed on Apr. 4, 2014, in the Korean Intellectual Property Office, all of which are incorporated herein by reference in their entirety.

FIELD

The present application relates to a curable composition and its use.

BACKGROUND

A light-emitting diode (LED) is a diode used in various fields such as a light source of a display device and lighting. As an LED encapsulant, an epoxy resin having a high adhesive property and excellent mechanical durability is being widely used. However, the epoxy resin has lower light transmittance of a blue light or UV ray region, and low thermal resistance and light resistance. Accordingly, for example, the patent documents 1 to 3 disclose techniques for solving the above-described problems. However, encapsulants disclosed in the above references do not have sufficient thermal resistance and light resistance.

In addition, to maintain stable performance under various and harsh conditions in which LEDs are encountered, a material having excellent transparency, initial speed of light, high temperature thermal resistance, thermal impact resistance, and gas permeability is demanded.

PRIOR ART DOCUMENTS

PATENT DOCUMENT 1: Japanese Laid-Open Patent Application No. H11-274571
PATENT DOCUMENT 2: Japanese Laid-Open Patent Application No. 2001-196151
PATENT DOCUMENT 3: Japanese Laid-Open Patent Application No. 2002-226551

DESCRIPTION

The present application is directed to providing a curable composition and its use.

Solution

One aspect of the present application provides a curable composition including components that can be cured by hydrosilylation, for example, a reaction between an aliphatic unsaturated bond and a hydrogen atom binding to a silicon atom. For example, the curable composition may include a polyorganosiloxane including an aliphatic unsaturated bond and a polyorganosiloxane including a hydrogen atom binding to a silicon atom.

The term "M unit" used herein may refer to a monofunctional siloxane unit possibly represented by the formula of $R_3SiO_{1/2}$ in the field of art, and the term "D unit" used herein may refer to a bifunctional siloxane unit possibly represented by the formula of $R_2SiO_{2/2}$ in the field of art, the term "T unit" used herein may refer to a trifunctional siloxane unit possibly represented by the formula of $RSiO_{3/2}$ in the field of art, and the term "Q unit" used herein may refer to a tetrafunctional siloxane unit possibly represented by the formula of $SiO_{4/2}$.

Here, R is a functional group binding to a silicon (Si) atom, and may be, for example, a hydrogen atom, an epoxy group, or a monovalent hydrocarbon group.

The curable composition may include a crosslinked polyorganosiloxane including an aliphatic unsaturated bond. The term "crosslinked polyorganosiloxane" used herein may refer to a polyorganosiloxane, which essentially includes a T or Q unit, and has a ratio (D/(D+T+Q)) of a D unit to the D, T, and Q units of more than 0 and less than 0.7. In another embodiment, the ratio (D/(D+T+Q)) in the crosslinked polyorganosiloxane may be 0.65 or less, 0.6 or less, 0.55 or less, 0.5 or less, 0.45 or less, 0.4 or less, or 0.35 or less.

The crosslinked polyorganosiloxane may include two kinds of low-refractive-index polyorganosiloxane. The term "low-refractive-index polyorganosiloxane" used herein may be a polyorganosiloxane including an aryl group in a molecule with a small amount, or substantially excluding an acryl group. For example, the low-refractive-index polyorganosiloxane may be a polyorganosiloxane having a molar ratio (Ar/Si) of an aryl (Ar) group to total silicon (Si) atoms of the polyorganosiloxane of approximately 0.3 or less, approximately 0.2 or less, approximately 0.15 or less, or substantially 0.

The term "aryl group" used herein may refer to, unless particularly defined otherwise, a monovalent residue derived from a compound having a structure to which a benzene ring or at least two benzene rings are linked, or in which one or at least two carbon atoms are covalently condensed or connected or a derivative thereof. In the specification, in the category of aryl groups, a functional group conventionally referred to as an aryl group, and an aralkyl group or arylalkyl group may be included. The aryl group may be, for example, an aryl group having 6 to 25, 6 to 21, 6 to 18, or 6 to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

A mixture of the crosslinked polyorganosiloxane may include first and second crosslinked polyorganosiloxanes, which include an M unit of Formula A and an M unit of Formula B, and have different ratios (B/(A+B)) of a number of moles (B) of the M unit of Formula B with respect to the sum of numbers of moles (A+B) of the M units of Formulas A and B.

For example, the mixture may include the first crosslinked polyorganosiloxane having the ratio (B/(A+B)) of 0.1 to 0.35, 0.1 to 0.3, or 0.1 to 0.25, and the second crosslinked polyorganosiloxane having the ratio (B/(A+B)) of 0.2 to 1, 0.2 to 0.9, 0.2 to 0.8, 0.2 to 0.7, 0.3 to 0.7, or 0.35 to 0.65. The ratio (B/(A+B)) of the first crosslinked polyorganosiloxane may be different from that of the second crosslinked polyorganosiloxane.

$(R^a_3SiO_{1/2})$ [Formula A]

$(R^b R^a_2 SiO_{1/2})$ [Formula B]

In Formulas A and B, $R^a$ is an alkyl group, and $R^b$ is an alkenyl group.

The term "alkyl group" used herein may refer to, unless particularly defined otherwise, an alkyl group having 1 to 20, 1 to 16, 1 to 12, 1 to 8, or 1 to 4 carbon atoms. The alkyl group may have a linear, branched, or cyclic structure. In addition, the alkyl group may be arbitrarily substituted with at least one substituent.

The term "alkenyl group" used herein may refer to, unless particularly defined otherwise, an alkenyl group having 2 to 20, 2 to 16, 2 to 12, 2 to 8, or 2 to 4 carbon atoms. The alkenyl group may have a linear, branched, or cyclic structure, and may be arbitrarily substituted with at least one substituent.

For example, the first crosslinked polyorganosiloxane may be a low-refractive-index crosslinked polyorganosiloxane having an average empirical formula of Formula 1, and the second crosslinked polyorganosiloxane may be a low-refractive-index crosslinked polyorganosiloxane having an average empirical formula of Formula 2.

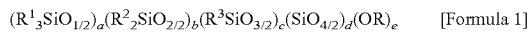  [Formula 1]

In Formula 1, $R^1$ to $R^3$ are each independently an epoxy group or a monovalent hydrocarbon group, at least one of $R^1$ to $R^3$ is an alkenyl group, R is hydrogen or a monovalent hydrocarbon group, a, b, c, d, and e are each independently 0 or a positive number, d/(c+d) is 0.3 or more, and e/(c+d) is 0.2 or less.

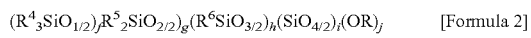  [Formula 2]

In Formula 2, $R^4$ to $R^5$ are each independently an epoxy group or a monovalent hydrocarbon group, at least one of $R^4$ to $R^5$ is an alkenyl group, R is hydrogen or a monovalent hydrocarbon group, f, g, h, i, and j are each independently 0 or a positive number, i/(h+i) is 0.3 or more, and j/(h+i) is 0.2 or less.

When the first or second crosslinked polyorganosiloxane is a low-refractive-index crosslinked polyorganosiloxane having a ratio (Ar/Si) of the aryl group of substantially 0, the monovalent hydrocarbon group in Formula 1 or 2 may be a monovalent hydrocarbon group excluding an aryl group.

In the specification, the expression that the polyorganosiloxane has a specific average empirical formula may mean that the polyorganosiloxane is composed of a single component represented by the average empirical formula, or a mixture of at least two components, and an average of a composition of the components of the mixture is represented by the average empirical formula.

In the specification, the term "epoxy group" used herein may refer to, unless particularly defined otherwise, a monovalent residue derived from a cyclic ether having three ring-forming atoms or a compound including the cyclic ether. The epoxy group may be a glycidyl group, an epoxyalkyl group, a glycidoxyalkyl group, or an alicyclic epoxy group. Here, the alicylic epoxy group may include a monovalent residue derived from a compound including an aliphatic hydrocarbon ring structure, and a structure in which two carbon atoms forming the aliphatic hydrocarbon ring also form an epoxy group. The alicyclic epoxy group may be an alicyclic epoxy group having 6 to 12 carbon atoms, for example, a 3,4-epoxycyclohexylethyl group.

The term "monovalent hydrocarbon group" used herein, unless particularly defined otherwise, may refer to a monovalent residue derived from a compound composed of carbon and hydrogen, or a derivative thereof. For example, the monovalent hydrocarbon group may include 1 to 25 carbon atoms. The monovalent hydrocarbon group may be an alkyl group, an alkenyl group, an aryl group, or an alkynyl group. However, in Formulas 1 and 2, the monovalent hydrocarbon group is a monovalent hydrocarbon group excluding an aryl group.

The term "alkynyl group" used herein may refer to, unless particularly defined otherwise, an alkynyl group having 2 to 20, 2 to 16, 2 to 12, 2 to 8, or 2 to 4 carbon atoms. The alkynyl group may have a linear, branched, or cyclic structure, and may be arbitrarily substituted with at least one substituent.

As a substituent that may be arbitrarily substituted to an epoxy group or a monovalent hydrocarbon group, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group, or a monovalent hydrocarbon group may be used, but the present application is not limited thereto.

In Formula 1, one or at least two of $R^1$ to $R^3$ may be an alkenyl group. In one embodiment, the alkenyl group may be present in an amount such that the molar ratio (Ak/Si) of the alkenyl (Ak) group to total silicon (Si) atoms included in the first crosslinked polyorganosiloxane is 0.03 to 0.3 or 0.05 to 0.25. As the molar ratio (Ak/Si) is controlled to 0.03 or more or 0.05 or more, reactivity may be suitably maintained, and a phenomenon of leaking an unreacted component from a surface of a cured product may be prevented. In addition, as the molar ratio (Ak/Si) is controlled to 0.3 or less or 0.25 or less, excellent hardness, crack resistance, and thermal impact resistance of the cured product may be maintained.

In the average empirical formula of Formula 1, a, b, c, and d are each a molar ratio of each siloxane unit, and when a sum (a+b+c+d) of the molar ratios is converted into 1, a is 0.2 to 0.8, 0.3 to 0.7, 0.3 to 0.6, or 0.3 to 0.55, b is 0 to 0.5, 0 to 0.4, 0 to 0.3 0 to 0.2, or 0 to 0.15, c is 0 to 0.5, 0 to 0.4, 0 to 0.3, 0 to 0.2, or 0 to 0.1, and d may be 0.2 to 0.8, 0.25 to 0.75, 0.3 to 0.8, 0.3 to 0.7, 0.3 to 0.6, or 0.3 to 0.55. To maximize strength, crack resistance, and thermal impact resistance of the cured product, (a+b)/(a+b+c+d) may be controlled to 0.3 to 0.8, 0.4 to 0.8, 0.5 to 0.8, or 0.5 to 0.7. In Formula 1, d/(c+d) may be controlled to 0.3 or more, 0.5 or more, 0.7 or more, 0.8 or more, or 0.9 or more. Here, the upper limit of d/(d+c) may be, but is not particularly limited to, 1.

In Formula 1, e is an amount of a condensable functional group included in the polyorganosiloxane, for example, a hydroxyl group or an alkoxy group. Such a condensable functional group may be, for example, a functional group of the condensable functional groups present in a crude material used in preparation of the crosslinked polyorganosiloxane, which is unreacted and remains. In Formula 1, e is 0 or a positive number, and for example, in Formula 1, e/(c+d) may be present in the range of 0.2 or less, 0.1 or less, 0.05 or less, or 0. By the control as described above, compatibility between the components of the curable composition is maintained, and thereby a cured product having excellent transparency may be formed after curing, and in addition, vapor resistance of the cured product may also be excellently maintained. For example, when the cured product is applied to a semiconductor device, long-term reliability of the device may also be ensured.

In Formula 2, one or at least two of $R^4$ to $R^6$ may be an alkenyl group. In one embodiment, the alkenyl group may be present in such an amount that a ratio (Akr/Si) of a number of moles (Ak) of the alkenyl group with respect to a number of moles (Si) of total silicon atoms of the second crosslinked polyorganosiloxane is 0.01 to 0.4, 0.03 to 0.35, 0.1 to 0.4, or 0.15 to 0.35. As the molar ratio (Ak/Si) is controlled as described above, reactivity may be suitably maintained, a phenomenon of leaking unreacted components from a surface of the cured product may be prevented, and the hardness, crack resistance, and thermal impact resistance of the cured product may be excellently maintained.

In the average empirical formula of Formula 2, f, g, h, and i are molar ratios of siloxane units, and when the sum is converted into 1, f is 0.1 to 0.8, 0.1 to 0.7, 0.1 to 0.6, 0.1 to 0.5, 0.1 to 0.4, 0.1 to 0.3, or 0.1 to 0.25, g is approximately 0 to 0.5, 0.1 to 0.5, or 0.2 to 0.4, h is 0 to 0.5, 0 to 0.4, 0 to 0.3, 0 to 0.2, 0 to 0.1, or 0 to 0.05, and i is 0.2 to 0.8, 0.3 to 0.8, 0.4 to 0.8, or 0.5 to 0.8. To maximize the strength, crack resistance, and thermal impact resistance of the cured product, (f+g)/(f+g+ h+i) may be controlled to 0.3 to 0.8, 0.3 to 0.7, or 0.3 to 0.6. In addition, in Formula 2, i/(h+i) may be controlled to 0.3 or more, 0.5 or more, 0.7 or more, 0.8 or more, or 0.9 or more. Here, the upper limit of i/(h+i) may be, but is not particularly limited to, 1.

In Formula 2, j is an amount of a condensable functional group included in the polyorganosiloxane, for example, a hydroxyl group or an alkoxy group. In Formula 2, j is 0 or a positive number, and for example, may be determined in such a range that j/(h+i) in Formula 2 is 0.2 or less, 0.15 or less, or 0.1 or less. Accordingly, as compatibility between components of the curable composition is maintained, a cured product having excellent transparency may be formed after curing, vapor resistance of the cured product may be excellently maintained, and when the cured product is applied to, for example, a semiconductor device, long-term reliability of the device may also be ensured.

A mixture of the polyorganosiloxanes may include the first and second crosslinked polyorganosiloxanes in a suitable ratio, and may include the second crosslinked polyorganosiloxane, for example, at 5 to 2,000 parts by weight or 10 to 1,000 parts by weight with respect to 100 parts by weight of the first crosslinked polyorganosiloxane. In the specification, unless particularly defined otherwise, the units "parts by weight" may be a weight ratio between components.

The mixture of the crosslinked polyorganosiloxanes may have a viscosity at 25° C. of 1,000 cP or more or 2,000 cP or more, and accordingly, processability before curing and hardness after curing may be suitably maintained.

The mixture of the crosslinked polyorganosiloxane may have a weight average molecular weight (Mw) of, for example, 500 to 20,000 or 500 to 10,000. The term "weight average molecular weight" used herein may refer to a conversion value with respect to standard polystyrene measured by gel permeation chromatography (GPC). Unless particularly defined otherwise, the term "molecular weight" may refer to a weight average molecular weight. As the molecular weight of the polyorganosiloxane (A) is controlled to 500 or more, moldability before curing, or strength after curing may be effectively maintained, and as the molecular weight of the polyorganosiloxane is controlled to 20,000 or 10,000 or less, viscosity may be maintained to a suitable level.

A method of preparing each crosslinked polyorganosiloxane is not particularly limited, and a conventional method known in the art may be applied.

The curable composition may further include a polyorganosiloxane including a hydrogen atom binding to a silicon atom (hereinafter, referred to as a polyorganosiloxane (B)). The polyorganosiloxane (B) may have, for example, one or at least two hydrogen atoms binding to a silicon atom. The polyorganosiloxane (B) may be, for example, a high-refractive-index polyorganosiloxane. The term "high-refractive-index polyorganosiloxane" used herein may be a polyorganosiloxane including an aryl group in a molecule in a predetermined ratio or more. For example, in the specification, the high-refractive-index polyorganosiloxane may be a polyorganosiloxane having a ratio (Ar/Si) of a number of moles (Ar) of total aryl groups to a number of moles (Si) of total silicon atoms of 0.25 or more, 0.3 or more, 0.4 or more, 0.5 or more, 0.6 or more, or 0.65 or more. In the high-refractive-index polyorganosiloxane, the upper limit of the ratio (Ar/Si) may be, for example, 1.5, 1.0, or 0.9. The polyorganosiloxane (B) may be a solid or a liquid. In addition, the polyorganosiloxane (B) may have a linear structure, that is, a structure composed of only M and D units, or a structure including a T or Q unit. While not particularly limited, in the case of a linear structure, the hydrogen atom may bind to a silicon atom present at a terminal end of the linear structure. The polyorganosiloxane (B) may be a low-molecular-weight or single molecular compound. Accordingly, the polyorganosiloxane (B) may include 3 to 10, 3 to 9, 3 to 8, 3 to 7, 3 to 6, or 3 to 5 silicon atoms. Such a polyorganosiloxane (B) may have excellent reactivity to an aliphatic unsaturated bond. In addition, the polyorganosiloxane (B) may allow a cured product to enhance crack resistance, and to maintain gas permeability in a low level.

The polyorganosiloxane (B) may be a crosslinking agent for crosslinking a composition by a reaction with an aliphatic unsaturated bond. For example, crosslinking and curing may progress by an addition-reaction of a hydrogen atom of the polyorganosiloxane (B) and the aliphatic unsaturated bond of the polyorganosiloxane (A) and/or the polyorganosiloxane (B), such as an alkenyl group.

In the polyorganosiloxane (B), a ratio (H/Si) of a number of moles of the hydrogen (H) atom binding to a silicon atom with respect to a number of moles of total silicon (Si) atoms may be, for example, 1.0 or less, 0.9 or less, 0.8 or less, or 0.75 or less. The molar ratio (H/Si) may also be 0.1 or more, 0.2 or more, 0.3 or more, 0.4 or more, or 0.5 or more. In such a range, curability may be excellently maintained, and crack resistance and thermal impact resistance may be excellently maintained.

When the polyorganosiloxane (B) is a high-refractive-index polyorganosiloxane, a ratio (Ar/Si) of a number of moles of the aryl (Ar) group with respect to a number of moles of total silicon (Si) atoms included in the polyorganosiloxane (B) may be in the same range as the above-described molar ratio (Ar/Si) of the high-refractive-index polyorganosiloxane.

The polyorganosiloxane (B) may be a solid or liquid type. When the polyorganosiloxane (B) is a liquid type, a viscosity at 25° C. may be 300 mPa·s or less. When the viscosity of the polyorganosiloxane (B) is controlled as described above, excellent processability of the composition and excellent hardness of the cured product may be maintained. The polyorganosiloxane (B) may have a molecular weight of, for example, less than 1,000 or 800. When the molecular weight of the polyorganosiloxane (B) is 1,000 or more, strength of the cured product may be probably degraded. The lower limit of the molecular weight of the polyorganosiloxane (B) may be, but is not particularly limited to, 250.

As the polyorganosiloxane (B), various kinds of polyorganosiloxanes may be used as long as satisfying the above-described characteristics. For example, as the polyorganosiloxane (B), a compound of Formula 3 or 4 may be used.

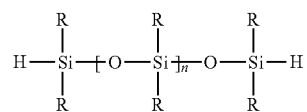

[Formula 3]

In Formula 3, R is each independently hydrogen, an epoxy group, or a monovalent hydrocarbon group, at least one R is an aryl group, and n is a number of 1 to 10.

In Formula 3, n may be, for example, 1 to 8, 1 to 6, 1 to 4, 1 to 3, or 1 to 2.

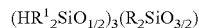

[Formula 4]

In Formula 4, $R^1$ and $R^2$ are each independently hydrogen, an epoxy group, or a monovalent hydrocarbon group, and at least one of $R^1$ and $R^2$ is an aryl group.

A content of the polyorganosiloxane (B) may be selected in such a range that a ratio (H/Ak) of a number of moles of a hydrogen (H) atom of the polyorganosiloxane (B) with respect to a number of moles of total aliphatic unsaturated bond-containing functional groups included in the curable composition, for example, alkenyl (Ak) groups included in the polyorganosiloxane (A) and the polyorganosiloxane (B) is 0.5 to 3.0 or 0.7 to 2.

As being blended in such a molar ratio (H/Ak), a composition having excellent processability and workability before curing, exhibiting excellent crack resistance, hardness, thermal impact resistance, and adhesive property after curing, and having no whitening or surface stickiness may be provided.

The curable composition may be a polyorganosiloxane including a hydrogen atom binding to a silicon atom, and may further include, for example, a polymeric compound having a low refractive index. For example, the curable composition may further include a polyorganosiloxane including a hydrogen atom binding to a silicon atom and 10 to 50 or 20 to 40 silicon atoms. The polyorganosiloxane may be a low-refractive-index polyorganosiloxane, and in this case, may have the above-described range of the molar ratio (Ar/Si) of the aryl group. The number of the silicon atoms included in the polyorganosiloxane may be 25 or more, 27 or more, or approximately 30 or more, and preferably, approximately 38 or less, or 36 or less. Such a compound is represented, for example, by Formula 3, and may include an aryl group of R, which is a monovalent hydrocarbon group, is included to satisfy the molar ratio (Ar/Si) of the aryl group of the low-refractive-index polyorganosiloxane. Here, n is in the range from 18 to 38. In addition, in this case, n may be 23 or more, 25 or more, or 28 or more, and preferably 36 or less or 34 or less. A ratio of such a compound included in the curable composition may be, but is not particularly limited to, for example, 5 to 30 parts by weight, 5 to 25 parts by weight, 5 to 20 parts by weight, or 5 to 15 parts by weight with respect to 100 parts by weight of the polyorganosiloxane (B). Unless particularly defined otherwise, the units "parts by weight" may be a weight ratio of each component to other components.

The curable composition may further include a compound having an average empirical formula of Formula 5 (hereinafter, referred to as a compound (C)) as a compound including a hydrogen atom.

$(HR_2SiO)_a(RSiO_{3/2})_b(R_2SiO_{2/2})_c$ [Formula 5]

In Formula 5, R is each independently a monovalent hydrocarbon group, at least one R is an aryl group, and when the sum (a+b+c) of a, b, and c is 1, a is 0.3 to 0.8, b is 0.2 to 0.7 or 0.2 to 0.5, and c is 0 to 0.5 or 0 to 0.3.

A ratio (H/Si) of a number of moles of hydrogen (H) atoms binding to a silicon atom with respect to a number of moles of total silicon (Si) atoms in the compound (C) may be, for example, approximately 0.2 to 1.0 or 0.4 to 1.0.

In addition, the ratio (Ar/Si) of a number of moles of aryl (Ar) groups binding to a silicon atom with respect to a number of moles of total silicon (Si) atoms in the compound (C) may be, for example, approximately 0 to 0.8 or 0.2 to 0.8.

When the compound (C) is used, the content may be suitably selected in consideration of, for example, the ratio of the polyorganosiloxane (B) or an amount of the aliphatic unsaturated bond.

The curable composition may further include a compound of Formula 6 (hereinafter, referred to as a compound (D)) as another compound including a hydrogen atom.

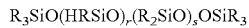

$R_3SiO(HRSiO)_r(R_2SiO)_sOSiR_3$ [Formula 6]

In Formula 6, R is each independently hydrogen, an epoxy group, or a monovalent hydrocarbon group, r is a number of 5 to 100, and s is a number of 0 to 100 or 5 to 100. In Formula 6, the monovalent hydrocarbon group may be, for example, a monovalent hydrocarbon group excluding an aryl group.

A ratio (H/Si) of a number of moles of hydrogen (H) atoms binding to a silicon atom with respect to a number of moles of total silicon (Si) atoms included in the compound (D) may be 0.2 to 1 or 0.3 to 1. Curability may be excellently maintained by controlling the molar ratio (H/Si) as described above. In addition, the compound (D) may have a viscosity at 25° C. of 0.1 cP to 100,000 cP, 0.1 cP to 10,000 cP, 0.1 cP to 1,000 cP, or 0.1 cP to 300 cP. When the compound (D) has the viscosity in the above range, processability of the composition and hardness of the cured product may be excellently maintained.

The ratio (Ar/Si) of a number of moles of an aryl (Ar) group binding to a silicon atom with respect to a number of moles of total silicon (Si) atoms of the compound (D) may be, for example, approximately 0 to 0.8 or 0 to 0.7.

A content of the compound (D) may be suitably controlled in consideration of an amount of total functional groups containing an aliphatic unsaturated bond included in the curable composition, for example, the amount of the alkenyl groups included in the polyorganosiloxane (A) and the amount of hydrogen atoms binding to a silicon atom included in the polyorganosiloxane (B).

The curable composition may further include a linear or partially-crosslinked polyorganosiloxane (hereinafter, referred to as a polyorganosiloxane (E)) as a compound including an aliphatic unsaturated bond. The term "linear polyorganosiloxane" used herein may be a polyorganosiloxane composed of M and D units, and the term "partially-crosslinked polyorganosiloxane" is a polyorganosiloxane which has a sufficiently long linear structure derived from the D unit, and to which a T or Q unit, for example, a T unit is partially introduced. For example, the polyorganosiloxane may have a ratio (D/(D+T+Q)) of the D unit with respect to the sum of the D, T, and Q units included therein of 0.7 or more, 0.75 or more, 0.8 or more, or 0.85 or more. The ratio (D/(D+T+Q)) may also be less than 1 or approximately 0.95 or less.

The polyorganosiloxane (E) may be a low-refractive-index polyorganosiloxane or a high-refractive-index polyorganosiloxane.

The polyorganosiloxane (E) may include at least one aliphatic unsaturated bond, for example, alkenyl group. For example, the polyorganosiloxane (E) may include the functional group in such an amount that a molar ratio (Ak/Si) of a functional group (Ak) including the aliphatic unsaturated bond, for example, an alkenyl group with respect to total silicon (Si) atoms included in the polyorganosiloxane (E) is 0.001 to 0.3. The molar ratio (Ak/Si) may be, in another embodiment, 0.01 or more, 0.02 or more, 0.03 or more, 0.04 or more, or 0.05 or more. In addition, the molar ratio (Ak/Si) may be, in another embodiment, 0.25 or less or 0.2 or less. Through such control, curability of a curable composition may be maintained in a suitable range, a phenomenon of leaking an unreacted component from a surface of a cured product after curing may be prevented, and excellent crack resistance may be maintained.

The polyorganosiloxane (E) may be a low-refractive-index polyorganosiloxane or a high-refractive-index polyorganosiloxane. For example, when the polyorganosiloxane (E) is a low-refractive-index polyorganosiloxane, excellent high temperature thermal resistance of the cured product may be maintained, and compatibility with another component may be increased.

The polyorganosiloxane (E) may have, for example, an average empirical formula of Formula 7.

$$(R^1{}_3SiO_{1/2})_a(R^2{}_2SiO_{2/2})_b(R^3{}_1SiO_{3/2})_c(SiO_{4/2})_d \quad \text{[Formula 7]}$$

In Formula 7, $R^1$ to $R^3$ are each independently an epoxy group or a monovalent hydrocarbon group, one or at least two of $R^1$ to $R^3$ are alkenyl groups, a, c, and d are each independently 0 or a positive number, and b is a positive number.

When the polyorganosiloxane (E) is a low-refractive-index compound, the monovalent hydrocarbon group may be a monovalent hydrocarbon group excluding an aryl group.

In Formula 7, one or at least two of $R^1$ to $R^3$ are alkenyl groups, and for example, an alkenyl group may be present within a range satisfying the above-described molar ratio (Ak/Si). Unless particularly limited, for example, the alkenyl group may be presented at the position of $R^3$.

In the average empirical formula of Formula 7, a, b, c, and d represent molar ratios of respective siloxane units of the polyorganosiloxane (E). When the sum (a+b+c+d) is converted into 1, a may be 0.001 to 0.2, 0.01 to 0.2, 0.02 to 0.2, 0.03 to 0.2, 0.04 to 0.2, or 0.04 to 0.1, b may be 0.7 to 0.999 or 0.7 to 0.95, c may be 0 to 0.3, more than 0 and 0.2 or less, or more than 0 and 0.1 or less, and d may be 0 to 0.3, 0 to 0.2, or 0 to 0.1.

In Formula 7, each siloxane unit may be present such that, for example, (c+d)/(a+b+c+d) is 0 to 0.3, 0 to 0.2, or 0 to 0.1. In addition, when the polyorganosiloxane (E) is partially crosslinked, in Formula 7, b/(b+c+d) may be more than 0.7, and less than 1. In another embodiment of the partial crosslink, b/(b+c+d) may be 0.7 to 0.97 or 0.65 to 0.97. As a ratio of the siloxane unit is controlled as described above, suitable physical properties may be ensured according to use or application.

The polyorganosiloxane (E) may be included in, for example, a ring-opening polymerization product of a mixture including a cyclic polyorganosiloxane. The reaction product includes a cyclic compound, for example, having a weight average molecular weight (Mw) of 800 or less, 750 or less, or 700 or less, for example, a cyclic polyorganosiloxane, whose ratio may be 7 wt % or less, 5 wt % or less, or 3 wt % or less. The lower limit of the ratio of the cyclic compound may be, for example, 0 wt % or 1 wt %. Through the control within the above range, a cured product having excellent long-term reliability and crack resistance may be provided. The term "weight average molecular weight" may mean a conversion value to standard polystyrene measured with gel permeation chromatography (GPC). Unless particularly defined otherwise, the term "molecular weight" may mean a weight average molecular weight.

The polyorganosiloxane (E) or a reaction product including the same has an area of a peak derived from an alkoxy group binding to a silicon atom with respect to an area of a peak derived from an aliphatic unsaturated bond-containing functional group binding to a silicon, for example, an alkenyl group such as a vinyl group of 0.01 or less, 0.005 or less, or 0 in a spectrum obtained by $^1$H NMR. Within the range, a suitable viscosity characteristic may be exhibited, and excellent other physical properties may also be maintained.

The polyorganosiloxane (E) or a reaction product including the same may have an acid value calculated by KOH titration of 0.02 or less, 0.01 or less, or 0. In this range, a suitable viscosity characteristic may be exhibited, and excellent other physical properties may be maintained.

The polyorganosiloxane (E) or a reaction product including the same may have a viscosity at 25° C. of 500 cP or more, 1,000 cP or more, 2,000 cP or more, or 5,000 cP or more. In this range, suitable processability and hardness may be maintained. The upper limit of the viscosity is not particularly limited, but the viscosity may be, for example, 500,000 cP or less, 400,000 cP or less, 300,000 cP or less, 200,000 cP or less, 100,000 cP or less, 80,000 cP or less, 70,000 cP or less, or 65,000 cP or less.

The polyorganosiloxane (E) or a reaction product including the same may have a molecular weight of 500 to 100,000 or 1,500 to 50,000. In this range, suitable moldability, hardness, and strength may be maintained.

A polymerization product including the polyorganosiloxane (E) may be, for example, a ring-opening polymerization product including a cyclic polyorganosiloxane. When the polyorganosiloxane (E) has a partially-crosslinked structure, the mixture may further include, for example, a cage structure or a partial cage structure, or a polyorganosiloxane including a T unit. As the cyclic polyorganosiloxane compound, for example, a compound represented by Formula 8 may be used.

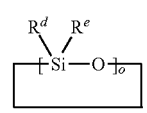

[Formula 8]

In Formula 8, $R^d$ and $R^e$ are each independently an epoxy group or a monovalent hydrocarbon group, and o is 3 to 6.

The cyclic polyorganosiloxane may also include a compound of Formula 9 and a compound of Formula 10.

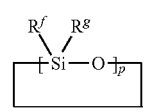

[Formula 9]

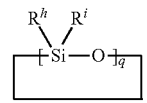

[Formula 10]

In Formulas 9 and 10, $R^f$ and $R^g$ are an epoxy group or an alkyl group, $R^h$ and $R^i$ are an epoxy group or a monovalent hydrocarbon group, p is a number of 3 to 6, and q is a number of 3 to 6.

In Formulas 8 to 10, specific kinds of $R^f$ to $R^i$, particular values of o, p, and q, and a ratio of each component in the mixture may be determined by a desired structure of the polyorganosiloxane (E).

When the polyorganosiloxane (E) has a partially-crosslinked structure, the mixture may include a compound having an average empirical formula of Formula 11 or a partial cage structure, or further include a compound having an average empirical formula of Formula 12 as the polyorganosiloxane including a T unit.

$$[R^jSiO_{3/2}] \quad \text{[Formula 11]}$$

$$[R^kR^l{}_2SiO_{1/2}]_p[R^mSiO_{3/2}]_q \quad \text{[Formula 12]}$$

In Formulas 11 and 12, $R^j$, $R^k$, and $R^m$ are each independently an epoxy group or a monovalent hydrocarbon group, $R^l$ is an epoxy group or an alkyl group having 1 to 4 carbon atoms, p is a number of 1 to 3, and q is a number of 1 to 10.

In Formulas 11 and 12, specific kinds of $R^j$ to $R^m$, particular values of p and q, and a ratio of each component in the mixture may be determined by a desired structure of the polyorganosiloxane (E).

When the cyclic polyorganosiloxane has a cage structure and/or a partial cage structure, or reacts with a polyorganosiloxane including a T unit, a polyorganosiloxane having a desired partially-crosslinked structure may be synthesized in a sufficient molecular weight. In addition, according to the above method, a desired product having excellent physical properties may be prepared by minimizing a functional group such as an alkoxy or hydroxyl group binding to a silicon atom in the polyorganosiloxane or a polymerization product including the same.

In one embodiment, the mixture may further include a compound represented by Formula 13.

$(R''R^{o}{}_{2}Si)_{2}O$  [Formula 13]

In Formula 13, $R''$ and $R^{o}$ are an epoxy group or a monovalent hydrocarbon group.

In Formula 13, a specific kind of the monovalent hydrocarbon group or a blending ratio in the mixture may be determined according to a desired polyorganosiloxane (E).

A reaction of each component in the mixture may be performed in the presence of a suitable catalyst. Accordingly, the mixture may further include a catalyst.

The catalyst which may be included in the mixture may be, for example, a base catalyst. A suitable base catalyst may be, but is not limited to, a metal hydroxide such as KOH, NaOH, or CsOH; a metal silanolate including an alkali metal compound and a siloxane; or a quaternary ammonium compound such as tetramethylammonium hydroxide, tetraethylammonium hydroxide, or tetrapropylammonium hydroxide.

A ratio of the catalyst in the mixture may be suitably selected in consideration of desired reactivity, and may be, for example, 0.01 to 30 parts by weight or 0.03 to 5 parts by weight with respect to 100 parts by weight of a total weight of a reaction product in the mixture. Unless particularly defined otherwise, the units "parts by weight" mean a weight ratio between components.

In one embodiment, a reaction of the mixture may be performed in the absence of a solvent or the presence of a suitable solvent. Any kind of a solvent may be used as long as a reaction product in the mixture, that is, disiloxane or polysiloxane, may be suitably mixed with the catalyst, and it does not have a significant influence on reactivity. The solvent may be, but is not limited to, an aliphatic hydrocarbon-based solvent such as n-pentane, i-pentane, n-hexane, i-hexane, 2,2,4-trimethyl pentane, cyclohexane, or methylcyclohexane; an aromatic solvent such as benzene, toluene, xylene, trimethyl benzene, ethyl benzene, or methylethyl benzene; a ketone-based solvent such as methylethylketone, methylisobutylketone, diethylketone, methyl n-propyl ketone, methyl n-butyl ketone, cyclohexanone, methylcyclohexanone, or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether, or propyleneglycol dimethyl ether; an ester-based solvent such as diethyl carbonate, methyl acetate, ethyl acetate, ethyl lactate, ethyleneglycol monomethyl ether acetate, propyleneglycol monomethyl ether acetate, or ethyleneglycol diacetate; or an amide-based solvent such as N-methyl pyrrolidone, formamide, N-methyl formamide, N-ethyl formamide, N,N-dimethyl acetamide, or N,N-diethylacetamide.

The reaction of the mixture, for example, a ring opening polymerization reaction, may be performed by adding the catalyst to the reaction product at a reaction temperature of, for example, 0 to 150° C. or 30 to 130° C. In addition, a reaction time may be controlled within a range of, for example, 1 hour to 3 days.

The curable composition may further include a hydrosilylation catalyst. The hydrosilylation catalyst may be used to stimulate a hydrosilylation reaction. As the hydrosilylation catalyst, all of conventional components known in the art may be used. As such a catalyst, a platinum-, palladium-, or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum, or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 to 200 ppm, and preferably 0.2 to 100 ppm based on an atomic weight of platinum, palladium, or rhodium.

The curable composition may further include a tackifier in terms of further enhancement in adhesive property to various kinds of substrates. The tackifier is a component capable of improving a self-adhesive property to the composition or cured product, and may improve a self-adhesive property particularly to a metal and an organic resin.

The tackifier may be, but is not limited to, a silane having at least one or two functional groups selected from the group consisting of an alkenyl group such as a vinyl group, a (meth)acryloyloxy group, a hydrosilyl (SiH) group, an epoxy group, an alkoxy group, an alkoxysilyl group, a carbonyl group, and a phenyl group; or an organic silicon compound such as a cyclic or linear siloxane having 2 to 30 or 4 to 20 silicon atoms. In the specification, one or at least two of the tackifiers may be additionally mixed and used.

In one embodiment, as the tackifier, a polyorganosiloxane which includes an alkenyl group and an epoxy group, which bind to a silicon atom, and has a molar ratio (Ak/Si) of an alkenyl (Ak) group to total silicon (Si) atoms in a range of 0.02 to 0.5, 0.08 to 0.5, 0.1 to 0.5, or 0.1 to 0.4, a molar ratio (Ar/Si) of an aryl (Ar) group to total silicon (Si) atoms in a range of 0.45 or less, 0.3 or less, 0.2 or less, 0.1 or less, or 0.05 or less, and a molar ratio (Ep/Si) of an epoxy (Ep) group to total silicon (Si) atoms in a range of 0.01 to 0.5, 0.05 to 0.5, 0.1 to 0.5, or 0.1 to 0.45, may be used.

For example, the tackifier may have an average empirical formula of Formula 14.

$(R^{1}{}_{3}SiO_{1/2})_{a}(R^{2}{}_{2}SiO_{2/2})_{b}(R^{3}SiO_{3/2})_{c}(SiO_{4/2})_{d}(OR)_{e}$  [Formula 14]

In Formula 14, R and $R^{1}$ to $R^{3}$ may be each independently a monovalent hydrocarbon group or an epoxy group, at least one of $R^{1}$ to $R^{3}$ may be an alkenyl group or an epoxy group, each of a, b, c, d, and e may be 0 or a positive number, c/(c+d) may be 0.3 or more, and e/(c+d) may be 0.2 or less. However, here, at least one of c and d may be a positive number.

When the tackifier is a low-refractive-index component not substantially including an aryl group, each of the R and $R^{1}$ to $R^{3}$ may be the above substituent excluding an aryl group. When the tackifier is a low-refractive-index component, in Formula 14, an aryl group may be included to have the above-described molar ratio (Ar/Si) of the aryl group of 0.3 or less, 0.2 or less, or 0.15 or less, or substantially 0.

In Formula 14, one or at least two of $R^{1}$ to $R^{3}$ may be an alkenyl group. In one embodiment, in Formula 14, the alkenyl group may be included to satisfy the above-described molar ratio (Ak/Si). In addition, in Formula 14, at least one of $R^{1}$ to $R^3$ may be an epoxy group. In one embodiment, in Formula 14, the epoxy group may be included to satisfy the above-described molar ratio (Ep/Si).

In the average empirical formula of Formula 14, a, b, c, and d are molar ratios of siloxane units, and when the sum (a+b+c+d) is converted into 1, a may be 0.2 to 0.8, 0.3 to 0.8, 0.3 to 0.7, or 0.3 to 0.6, b may be 0 to 0.5, 0 to 0.4, 0 to 0.3, or 0 to 0.2, c may be 0 to 0.8, 0.1 to 0.7, 0.1 to 0.65, 0.1 to 0.6, or 0.1 to 0.5, and d may be 0 to 0.5, 0 to 0.4, 0 to 0.3, or 0 to 0.2. In the average empirical formula of Formula 14, c/(c+d) may be 0.3 or more, 0.5 or more, 0.65 or more, or 0.7 or more. As the molar ratios of the siloxane units of the tackifier are controlled as described above, a semiconductor device maintaining an excellent adhesive property of a cured product and having excellent reliability may be provided. The upper limit of the c/(c+d) may be, but is not particularly limited to, for example, 1, 0.9, 0.8, or 0.75.

In Formula 14, e indicates an amount of a condensable functional group included in the polyorganosiloxane, for example, a hydroxyl group or an alkoxy group. In Formula 14, e is 0 or a positive number, and for example, in Formula 14, e/(c+d) may be presented in a range to be 0.2 or less, 0.15 or less, 0.1 or less, or 0.05 or less. As compatibility between components of the curable composition is maintained through such control, a cured product having excellent transparency after curing may be formed. In addition, excellent vapor resistance of the cured product may be maintained, and when the cured product is applied to, for example, a semiconductor device, long-term reliability of the device may also be ensured. In the polyorganosiloxane, the condensable functional group should not be present if possible, and thus the lower limit of the e/(c+d) is not particularly limited.

Such a tackifier may have, for example, a molecular weight of 500 to 20,000 or 500 to 10,000.

For example, the tackifier may be included in the curable composition in a ratio of 0.1 to 20 parts by weight with respect to 100 parts by weight of a solid content of the composition, but the content may be suitably changed in consideration of desired improvement in adhesive property.

The curable composition may further include one or at least two of additives including a reaction inhibitor such as 2-methyl-3-butyne-2-ol, 2-phenyl-3-1-butyne-2-ol, 3-methyl-3-penten-1-yne, 3,5-dimethyl-3-hexen-1-yne, 1,3,5,7-tetramethyl-1,3,5,7-tetrahexenylcyclotetrasiloxane, or ethynylcyclohexane; an inorganic filler such as silica, alumina, zirconia, or titania; a carbon-functional silane having an epoxy group and/or alkoxysilyl group, a partial hydrolysis-condensation product thereof or a siloxane compound; a thixotropic agent such as a haze-phase silica that can be used in combination with polyether; a filler; a phosphor; a conductivity providing agent such as metal powder of silver, copper, or aluminum or various carbon materials; or a color adjusting agent such as a pigment or dye as needed.

Another aspect of the present application provides a semiconductor device, for example, an optical semiconductor device. The illustrative semiconductor device may be encapsulated with an encapsulant including a cured product of the curable composition. Examples of a semiconductor device encapsulated with an encapsulant include a diode, a transistor, a thyristor, a photocoupler, a CCD, a solid-phase image pick-up diode, a monolithic IC, a hybrid IC, an LSI, a VLSI, or a light-emitting diode (LED). In one embodiment, the semiconductor device may be an LED.

The LED may be one formed by stacking a semiconductor material on a substrate. The semiconductor material may be, but is not limited to, GaAs, GaP, GaAlAs, GaAsP, AlGaInP, GaN, InN, MN, InGaAlN, or SiC. In addition, as the substrate, a sapphire, spinel, SiC, Si, ZnO, or GaN single crystal may be used.

In addition, to prepare the LED, when necessary, a buffer layer may be formed between a substrate and a semiconductor material. As a buffer layer, GaN or AlN may be used. A method of stacking a semiconductor material on a substrate may be, but is not particularly limited to, MOCVD, HDVPE, or liquid growth. In addition, a structure of the LED may be, for example, a mono junction including an MIS junction, a PN junction, and a PIN junction, a hetero junction, or a double hetero junction. In addition, the LED may be formed using a mono or multiple quantum well structure.

In one embodiment, an emission wavelength of the LED may be, for example, 250 to 550 nm, 300 to 500 nm, or 330 to 470 nm. The emission wavelength may refer to a main emission peak wavelength. As the emission wavelength of the LED is set in the above range, a white LED having a longer life span, high energy efficiency, and high color expression may be obtained.

The LED may be encapsulated using the composition. In addition, the encapsulation of the LED may be performed only using the composition, and in some cases, another encapsulant may be used in combination with the composition. When two kinds of encapsulants are used in combination, after the encapsulation using the composition, the encapsulated LED may also be encapsulated with another encapsulant, or the LED may be encapsulated with another encapsulant and then encapsulated again with the composition. As another encapsulant, an epoxy resin, a silicon resin, an acryl resin, a urea resin, an imide resin, or glass may be used.

To encapsulate the LED with the curable composition, for example, a method including previously injecting the composition into a mold, dipping a lead frame to which the LED is fixed therein and curing the composition, or a method including injecting the composition into a mold into which the LED is inserted and curing the composition may be used. As a method of injecting the composition, injection by a dispenser, transfer molding, or injection molding may be used. In addition, as other encapsulating methods, a method of dropping the composition on the LED, coating the composition by screen printing or using a mask, and curing the composition, and a method of injecting the composition into a cup in which the LED is disposed on a bottom by a dispenser and curing the composition may be included.

In addition, the curable composition may be used as a diamond material fixing the LED to a lead terminal or package, or a passivation layer or package substrate on the LED as needed.

When it is necessary to cure the composition, the curing may be performed by maintaining the composition, for example, at a temperature of 60 to 200° C. for 10 minutes to 5 hours, or in at least two steps at a suitable temperature and for a suitable time, but the present application is not limited thereto.

A shape of the encapsulant is not particularly limited, and for example, may be a bullet-type lens, planar, or thin film shape.

In addition, additional enhancement of performance of the LED may be promoted according to the conventional method known in the art. To enhance performance, for example, a method of disposing a reflective layer or light collecting layer on a back surface of the LED, a method of forming a complementary coloring part on its bottom, a method of disposing a layer absorbing light having a shorter wavelength than the main emission peak on the LED, a method of encapsulating the LED and further molding the LED with a hard material, a method of inserting the LED into a through hole to be fixed, or a method of contacting the LED with a lead member by flip-chip contact to extract light from a direction of the substrate, may be used.

The LED may be effectively applied to, for example, backlights for liquid crystal displays (LCDs), lights, various kinds of sensors, light sources of a printer and a copy machine, light sources for an automobile gauge, signal lights, pilot lights, display devices, light sources of planar LEDs, displays, decorations, or various kinds of lights.

Effect

An illustrative curable composition can provide a cured product having excellent processability, workability, and adhesive property, and having no whitening and surface stickiness. The curable composition can also provide a cured product having excellent transparency, vapor resistance, mechanical characteristics, and crack resistance, and therefore, can exhibit excellent long-term reliability when being applied to various electronic parts.

Illustrative Embodiments

Hereinafter, a curable composition will be described in further detail with reference to Examples and Comparative Examples, but the range of the curable composition is not limited to the following Examples.

In the specification, the abbreviations "Vi," "Ph," "Me," and "Ep" refer to a vinyl group, a phenyl group, a methyl group, and a 3-glycidoxypropyl group, respectively.

1. Evaluation of Characteristics of Device

Characteristics of a device were evaluated using a 7020 LED package manufactured of polyphthalamide (PPA). A curable composition prepared in a PPA cup was dispensed, and then cured by being maintained at 60° C. 1 hour, at 80° C. for 1 hour, and then at 150° C. for 4 hours, thereby manufacturing a surface-mounting LED. Afterward, the manufactured LED was operated for 500 hours while being maintained at 85° C. with a current of 60 mA. Subsequently, a ratio of reduction in brightness after operation with respect to initial brightness before operation was measured, and evaluated according to the following criteria.

<Evaluation Criteria>

O: when the ratio of reduction in brightness with respect to initial brightness was 5% or less X: when the ratio of reduction in brightness with respect to initial brightness was more than 5%

2. Evaluation of High Temperature Thermal Resistance of Silicon Cured Product

High temperature thermal resistance was evaluated according to the following criteria by injecting a curable composition between two glass plates spaced 1 mm apart from each other, curing the composition at 60° C. for 1 hour, at 80° C. for 1 hour, and then at 150° C. for 4 hours, maintaining the cured product at 200° C. for 24 hours, and measuring a ratio of reduction in light transmittance with respect to initial light transmittance using a UV-Vis spectrometer. Here, the light transmittance was an average value of light transmittance at a wavelength of 400 nm to 450 nm.

<Evaluation Criteria>

O: when a ratio of reduction in light transmittance with respect to initial light transmittance was 5% or less X: when a ratio of reduction in light transmittance with respect to initial light transmittance was more than 5%

Example 1

A curable composition was prepared by preparing a mixture (blending amounts: Formula A: 40 g, Formula B: 60 g, Formula C: 16 g, and Formula D: 1.0 g) by mixing compounds represented by Formulas A to D prepared by known methods, and blending a catalyst (platinum(0)-1,3-divinyl-1,1,3,3-tetramethyldisiloxane) to have a content of Pt(0) of 2 ppm.

$(ViMe_2SiO_{1/2})(Me_3SiO_{1/2})(Me_2SiO_{2/2})_4(SiO_{4/2})_8$ [Formula A]

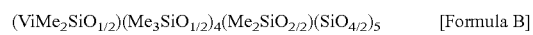

$(ViMe_2SiO_{1/2})(Me_3SiO_{1/2})_4(Me_2SiO_{2/2})(SiO_{4/2})_5$ [Formula B]

$(HMe_2SiO_{1/2})_2(MePhSiO_{2/2})$ [Formula C]

$(ViMe_2SiO_{1/2})_2(Me_3SiO_{1/2})_2(EpSiO_{3/2})_{2.5}(SiO_{4/2})$ [Formula D]

Example 2

A curable composition was prepared by the same method as described in Example 1, except that 20 g of a compound of Formula E was blended, instead of the compound of Formula C.

$(HMe_2SiO_{1/2})_2(Ph_2SiO_{2/2})$ [Formula E]

Example 3

A curable composition was prepared by the same method as described in Example 1, except that 20 g of the compound of Formula E and 2 g of a compound of Formula F were blended, instead of the compound of Formula C.

$(ViMe_2SiO_{1/2})_2(HMeSiO_{2/2})_{30}$ [Formula F]

Example 4

A curable composition was prepared under the same conditions as used in Example 1, except that 20 g of the compound of Formula E and 2 g of a compound of Formula G were blended, instead of the compound of Formula C.

$(HMe_2SiO_{1/2})_3(PhSiO_{3/2})$ [Formula G]

Comparative Example 1

A curable composition was prepared by the same method as described in Example 1, except that 95 g of the compound of Formula B was blended, without using the compound of Formula A.

Comparative Example 2

A curable composition was prepared by the same method as described in Example 1, except that 8 g of the compound of Formula F was blended instead of the compound of Formula C.

Comparative Example 3

A curable composition was prepared by mixing compounds of Formulas M, N, and O prepared by a known method with the compound of Formula E (blending amounts: Formula M: 40 g, Formula N: 100 g, Formula E: 51.5 g, Formula O: 1.5 g), and blending a catalyst by the same method as described in Example 1.

$(ViMe_2SiO_{1/2})_2(MePhSiO_{2/2})_{40}$ [Formula M]

$(ViMe_2SiO_{1/2})_2(MePhSiO_{3/2})_{0.3}(PhSiO_{3/2})_{3.5}$ [Formula N]

$(ViMe_2SiO_{1/2})_2(EpSiO_{3/2})_3(MePhSiO_{2/2})_{20}$ [Formula O]

Physical properties measured with respect to the Examples and Comparative Examples are summarized and listed in Table 1.

TABLE 1

| | Device reliability | High temperature thermal resistance |
|---|---|---|
| Example 1 | ○ | ○ |
| Example 2 | ○ | ○ |
| Example 3 | ○ | ○ |
| Comparative Example 1 | X | ○ |
| Comparative Example 2 | X | ○ |
| Comparative Example 3 | ○ | X |

What is claimed is:

1. A curable composition, comprising:
(A) a mixture of a first crosslinked polyorganosiloxane including a siloxane unit of Formula A and a siloxane unit of Formula B, having a ratio (B/(A+B)) of a molar ratio (B) of the siloxane unit of Formula B to a molar ratio (A+B) of the sum of the siloxane units of Formulas A and B of 0.1 to 0.35, and having a molar ratio (Ar/Si) of an aryl (Ar) group to a silicon (Si) atom of 0.3 or less, and a second crosslinked polyorganosiloxane including a siloxane unit of Formula A and a siloxane unit of Formula B, having a ratio (B/(A+B)) of a molar ratio (B) of the siloxane unit of Formula B to a molar ratio (A+B) of the sum of the siloxane units of Formulas A and B, which is different from that of the first crosslinked polyorganosiloxane, of 0.2 to less than 1, and having a molar ratio (Ar/Si) of an aryl (Ar) group to a silicon (Si) atom of 0.3 or less; and
(B) a polyorganosiloxane including a hydrogen atom and an aryl group, which bind to a silicon atom, having a molar ratio of an aryl (Ar) group to a silicon (Si) atom of 0.25 or more, and having 3 to 10 silicon atoms:

$(R^a{}_3SiO_{1/2})$ [Formula A]

$(R^bR^a{}_2SiO_{1/2})$ [Formula B]

where $R^a$ is an alkyl group, and $R^b$ is an alkenyl group.

2. The curable composition according to claim 1, wherein the molar ratio (Ak/Si) of an alkenyl (Ak) group to a silicon (Si) atom of the first crosslinked polyorganosiloxane is 0.03 to 0.3.

3. The curable composition according to claim 1, wherein the molar ratio (Ak/Si) of an alkenyl (Ak) group to a silicon (Si) atom of the second crosslinked polyorganosiloxane is 0.01 to 0.4.

4. The curable composition according to claim 1, wherein the first crosslinked polyorganosiloxane has an average empirical formula of Formula 1:

$(R^1{}_3SiO_{1/2})_a(R^2{}_2SiO_{2/2})_b(R^3SiO_{3/2})_c(SiO_{4/2})_d(OR)_e$ [Formula 1]

where R and $R^1$ to $R^3$ are each independently an epoxy group or a monovalent hydrocarbon group, at least one of $R^1$ to $R^3$ is an alkenyl group, R is hydrogen or a monovalent hydrocarbon group, each of a, b, c, and d is 0 or a positive number, d/(c+d) is 0.3 or more, and e/(c+d) is 0.2 or less.

5. The curable composition according to claim 1, wherein the second crosslinked polyorganosiloxane has an average empirical formula of Formula 2:

$(R^4{}_3SiO_{1/2})_f(R^5{}_2SiO_{2/2})_g(R^6SiO_{3/2})_h(SiO_{4/2})_i(OR)_j$ [Formula 2]

where R, $R^4$, and $R^5$ are each independently an epoxy group or a monovalent hydrocarbon group, at least one of $R^4$ and $R^5$ is an alkenyl group, R is hydrogen or a monovalent hydrocarbon group, f, g, h, i, and j are each independently 0 or a positive number, i/(h+i) is 0.3 or more, and j/(h+i) is 0.2 or less.

6. The curable composition according to claim 1, wherein the second crosslinked polyorganosiloxane is included at 5 to 2,000 parts by weight to 100 parts by weight of the first crosslinked polyorganosiloxane.

7. The curable composition according to claim 1, wherein the polyorganosiloxane (B) has a molecular weight of less than 1,000.

8. The curable composition according to claim 1, wherein the polyorganosiloxane (B) is a compound of Formula 3 or 4:

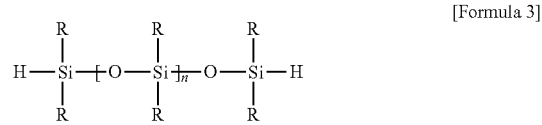

[Formula 3]

$(HR^1{}_2SiO_{1/2})_3(R^2SiO_{3/2})$ [Formula 4]

where R, $R^1$, and $R^2$ are each independently hydrogen, an epoxy group, or a monovalent hydrocarbon group, at least one R is an aryl group, at least one of $R^1$ and $R^2$ is an aryl group, and n is a number of 1 to 10.

9. The curable composition according to claim 1, wherein the polyorganosiloxane (B) is included in such a range that a molar ratio (H/Ak) of a hydrogen (H) atom binding to a silicon atom to total alkenyl (Ak) groups included in the curable composition is 0.5 to 3.0.

10. The curable composition according to claim 1, further comprising a polyorganosiloxane including a hydrogen atom binding to a silicon atom, having a molar ratio of an aryl (Ar) group to a silicon (Si) atom of 0.3 or less, and including 10 to 50 silicon atoms.

11. The curable composition according to claim 1, further comprising a compound having an average empirical formula of Formula 4:

$(HR_2SiO_{1/2})_a(RSiO_{3/2})_b(R_2SiO_{2/2})_c$ [Formula 4]

where R is each independently a monovalent hydrocarbon group, at least one R is an aryl group, and when the sum (a+b+c) of a, b, and c is 1, a is 0.3 to 0.8, b is 0.2 to 0.7, and c is 0 to 0.5.

12. The curable composition according to claim 11, wherein the compound of the average empirical formula of Formula 4 has a molar ratio (Ar/Si) of an aryl (Ar) group to a silicon (Si) atom of 0 to 0.8.

13. The curable composition according to claim 1, further comprising a compound of Formula 5:

$R_3SiO(HRSiO)_r(R_2SiO)_sOSiR_3$ [Formula 5]

where R is each independently hydrogen, an epoxy group, or a monovalent hydrocarbon group, r is 5 to 100, and s is 0 to 100.

14. The curable composition according to claim 13, wherein the compound of Formula 5 has a molar ratio (Ar/Si) of an aryl (Ar) group to a silicon (Si) atom of 0 to 0.8.

15. The curable composition according to claim 1, further comprising a polyorganosiloxane having a molar ratio (D/(D+T+Q)) of total bifunctional siloxane units (D) to the sum of a linear polyorganosiloxane or bifunctional siloxane unit (D), a trifunctional siloxane unit (T), and a tetrafunctional siloxane unit (Q) of 0.7 or more.

16. The curable composition according to claim 1, further comprising a polyorganosiloxane including alkenyl and epoxy groups, which bind to a silicon atom, and having a molar ratio (Ak/Si) of an alkenyl (Ak) group to total silicon (Si) atoms, a molar ratio (Ar/Si) of an aryl (Ar) group to total silicon (Si) atoms of 0.45 or less, and a molar ratio (Ep/Si) of an epoxy (Ep) group to total silicon (Si) atoms of 0.01 to 0.5.

17. A semiconductor device encapsulated with an encapsulant including a cured product of the curable composition of claim 1.

18. An optical semiconductor device encapsulated with an encapsulant including a cured product of the curable composition of claim 1.

19. A liquid crystal display device comprising the optical semiconductor device of claim 18.

20. A lighting apparatus comprising the optical semiconductor device of claim 18.

* * * * *